United States Patent
Hanson (10) Patent No.: US 9,666,263 B2
(45) Date of Patent: May 30, 2017

(54) DIMM SSD SOC DRAM BYTE LANE SKEWING

(71) Applicant: Craig Hanson, San Jose, CA (US)

(72) Inventor: Craig Hanson, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/973,720

(22) Filed: Dec. 17, 2015

(65) Prior Publication Data
US 2017/0103796 A1    Apr. 13, 2017

Related U.S. Application Data (60) Provisional application No. 62/238,659, filed on Oct. 7, 2015.

(51) Int. Cl.
| | |
|---|---|
| G11C 7/00 | (2006.01) |
| G11C 11/4076 | (2006.01) |
| G11C 11/4093 | (2006.01) |

(52) U.S. Cl.
CPC ...... *G11C 11/4076* (2013.01); *G11C 11/4093* (2013.01)

(58) Field of Classification Search
CPC ......... G11C 7/22; G11C 7/222; G11C 29/842; G06F 13/1689
USPC .............................................. 365/194, 51, 52
See application file for complete search history.

(56) References Cited

U.S. PATENT DOCUMENTS

| | | | |
|---|---|---|---|
| 7,434,114 B2 | 10/2008 | Jang et al. | |
| 7,725,783 B2 * | 5/2010 | Cases ................. | G01R 31/2815 365/201 |
| 7,975,164 B2 | 7/2011 | Lee et al. | |
| 8,073,090 B2 | 12/2011 | Zhang et al. | |
| 8,081,537 B1 * | 12/2011 | Bhakta ................ | G06F 12/0207 365/149 |
| 8,631,267 B2 | 1/2014 | Johnson | |
| 2015/0206560 A1 * | 7/2015 | Kang ................... | G11C 7/1066 711/103 |

\* cited by examiner

*Primary Examiner* — Huan Hoang
(74) *Attorney, Agent, or Firm* — Renaissance IP Law Group LLP (57) ABSTRACT

A Dual In-Line Memory Module (DIMM) Solid State Drive (SSD) System-on-a-Chip (SoC) (345) is disclosed. The DIMM SSD SoC (345) can interoperate with a host memory controller (335) as though it were a traditional Dynamic Random Access Memory (DRAM) DIMM (105, 130) with system interconnect skew and on-DIMM skew, even though the DIMM SSD SoC (345) does not have on-DIMM skew. The DIMM SSD SoC (345) can include variable delay elements (422, 424, 426, 428, 430, 432, 434, 436, 438) that can replicate the delay a traditional DRAM DIMM (105, 130) experiences and that the host memory controller (335) expects, or a superior delay that minimizes system signal integrity issues, thereby increasing maximum system speed.

16 Claims, 8 Drawing Sheets

Unregistered Memory

FIG. 1A
(Prior Art)

Registered Memory

DIMM SSD SOC DRAM BYTE LANE SKEWING

RELATED APPLICATION DATA

This application claims the benefit of U.S. Provisional Patent Application Ser. No. 62/238,659, filed Oct. 7, 2015, which is hereby incorporated by reference for all purposes.

FIELD

This inventive concept relates to memory, and more particularly to using a Dual In-Line Memory Module (DIMM) Solid State Drive (SSD) in place of a traditional DIMM.

BACKGROUND

Traditional Dual In-Line Memory Modules (DIMMs) include a multitude of Dynamic Random Access Memory (DRAM) elements carried on a signal substrate. The individual DRAM elements connect to signal lines that lead to the memory controller, allowing the individual DRAM elements to receive data from and transmit data to the memory controller.

The DIMM can also receive a clock signal from the host processor. The clock signal is then passed within the DIMM to each of the DRAM elements. The clock signals help guide the DRAM elements when to send data or when to expect to receive data (as such operations occur according to a predetermined schedule, such as the leading or trailing edge of the clock signal).

But even though DIMMs are not large and signals travel at nearly the speed of light, signals still take a measurable amount of time to travel along the DIMM. Recall that light takes approximately one nanosecond (1 ns) to travel one foot. With computers performing billions of operations per second, even small amounts of time can make a difference in how a DIMM operates. Different DRAM elements can receive their signals at different times: that is, the DRAM elements receive staggered signals. The JEDEC-defined Fly-By DIMM topology on the command/address/clock bus, combined with the application-defined board channel skew, contribute to the differing command address arrivals for which current memory controllers must account. Different DIMM designs can have different board channel skew.

Memory controllers are designed to handle a range of topology-based different arrival times and reasonable board channel skew. Memory controllers can perform training to learn exactly what the board channel skew is for a particular DIMM and interconnect to a DIMM. Different memory controllers have different limits on how much board channel skew they can tolerate. But all memory controllers expect DIMMs to have some board channel skew.

In contrast to traditional DIMMs, DIMM Solid State Drives (SSDs) do not have multiple DRAM elements. A DIMM SSD has only one chip, which stores all the data. As a result, a DIMM SSD has no command/address/clock skew: all data can be read and written at the same time. But because memory controllers expect a DIMM to have some byte/nibble skew, more-aligned launch times for the byte/nibble lanes can introduce noise can affect the operation of the system.

A need remains for a way to permit the use of DIMM SSDs with memory controllers the expect board channel skew.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1A:
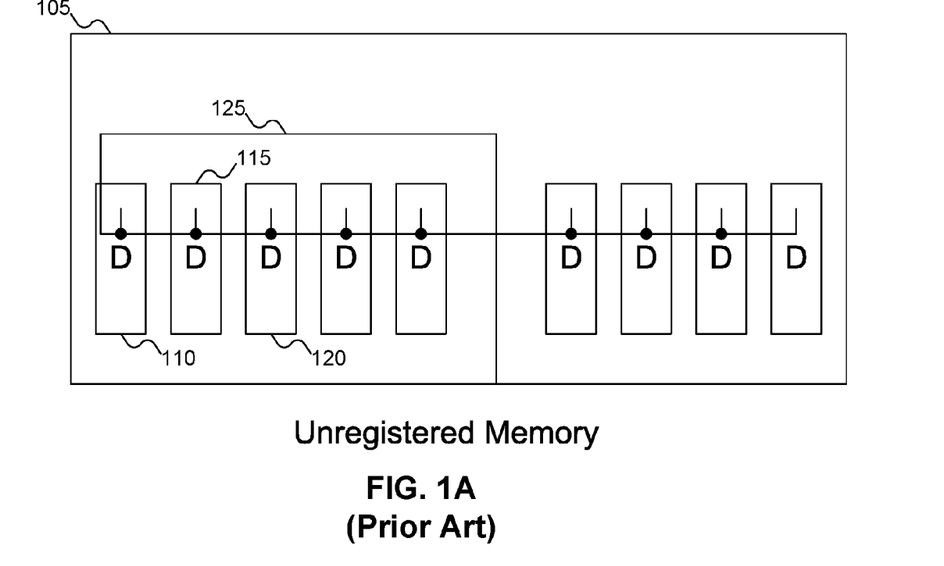
FIGS. 1A and 1B show prior art Dual In-Line Memory Modules (DIMMs).
Figure 1B:
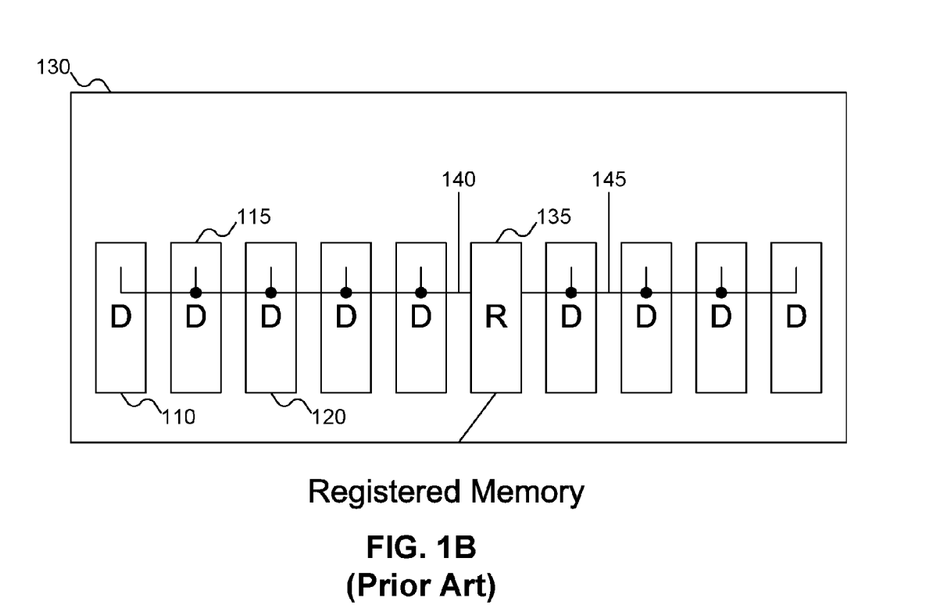

FIGS. 1A and 1B show prior art Dual In-Line Memory Modules (DIMMs). In FIG. 1A, unregistered DIMM 105 is shown. Unregistered DIMM 105 is sometimes referred to as unbuffered DIMM 105, because unregistered DIMM 105 lacks a register between the Dynamic Random Access Memory (DRAM) modules and the host memory controller.

Unregistered DIMM 105 includes a plurality of DRAM modules, such as DRAM modules 110, 115, and 120.

One or more lanes 125 (for signals such as a clock signal) can connect the host memory controller and DRAM modules 110, 115, and 120. As can be seen in FIG. 1A, lanes 125 travel from the host memory controller to DRAM module 110, then to DRAM module 115, then to DRAM module 120, and so on. A person skilled in the art will recognize that FIG. 1A is merely an example unregistered memory 105, and other designs of unregistered memory 105 are possible.

In comparison with FIG. 1A, FIG. 1B shows registered memory 130. Registered memory 130 includes DRAM modules 110, 115, and 120 like unregistered memory 105 of FIG. 1A. But registered memory 130 also includes register 135. Register 135 can act as a buffer between the host memory controller and DRAM modules 110, 115, and 120.

In contrast to FIG. 1A, where lanes 125 connect the host controller with all the DRAM modules in sequence, in FIG. 1B lanes 140 connect register 135 with some of the DRAM modules, and lanes 145 connect register 135 with other DRAM modules. A person skilled in the art will recognize that FIG. 1B is merely an example registered memory 130, and other designs of registered memory 130 are possible.

One common element to both unregistered memory 105 and registered memory 130 is the existence of multiple DRAM modules 110, 115, and 120, and that signals have to travel different lengths along lanes 125, 140, and 145 to reach DRAM modules 110, 115, and 120. Because the signals travel different lengths, signals arrive at DRAM modules 110, 115, and 120 at different times. This fact results in byte/nibble skew within DIMMs 105 and 130.

Figure 2A:
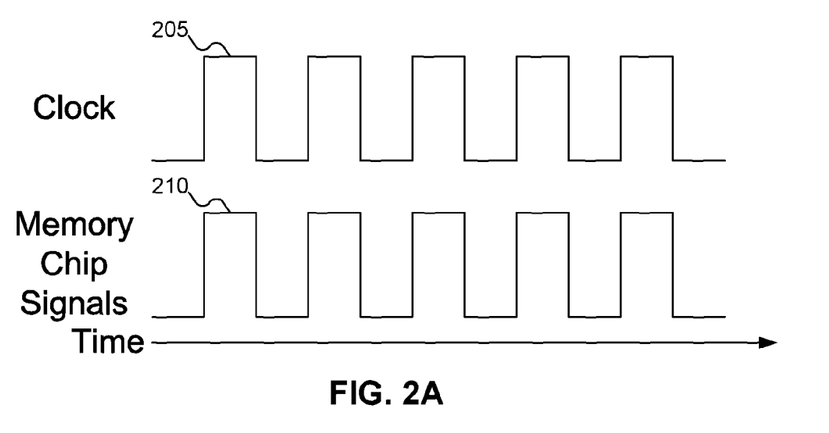
FIG. 2A shows a clock signal and an idealized memory chip with no board channel skew.

FIG. 2A shows a clock signal and an idealized memory chip with no board channel skew. In FIG. 2A, clock signal 205 and memory chip signal 210 are shown. Memory chip signal 210 is intended to represent the arrival of clock signal 205 at the memory chip, with time along the horizontal dimension. In an ideal world, memory chip signal 210 is perfectly synchronized with clock signal 205.

Unfortunately, the real world is not an ideal world. As mentioned above with reference to FIGS. 1A-1B, signals have to travel different lengths along lanes 125 of FIG. 1A in unregistered DIMM 105 of FIG. 1A, and along lanes 140 and 145 of FIG. 1B in registered DIMM 130 of FIG. 1B. As a result, signals arrive at DRAM modules 110, 115, and 615 at different times.

Figure 2B:
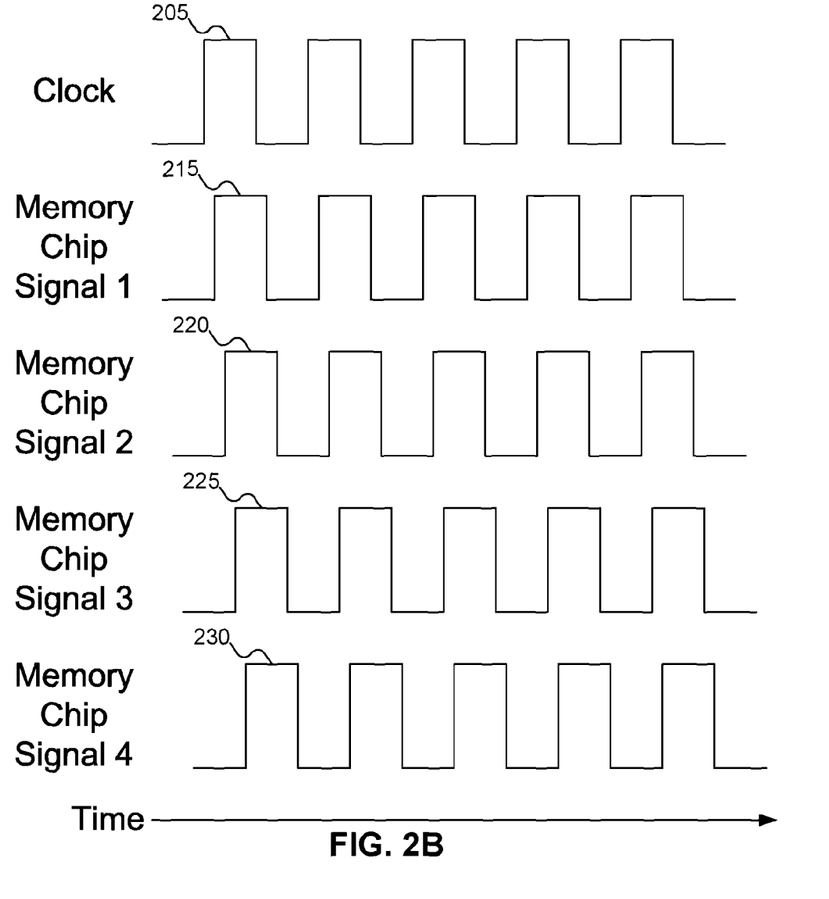
FIG. 2B shows a clock signal and memory chips with board channel skew.

FIG. 2B shows a clock signal and memory chip signals with system interconnect and DIMM skew. In FIG. 2B, each memory chip signal 215, 220, 225, and 230 is skewed relative to clock signal 205. (Often, pairs of memory chip signals are also skewed as well.)

Because signals do not arrive at the memory chips synchronous with clock signal 205, the host memory controller has to train itself to determine exactly how skewed memory chip signals 215, 220, 225, and 230 are. The process by which the host controller trains itself to learn the skew associated with each memory chip is a well understood process.

Figure 3:
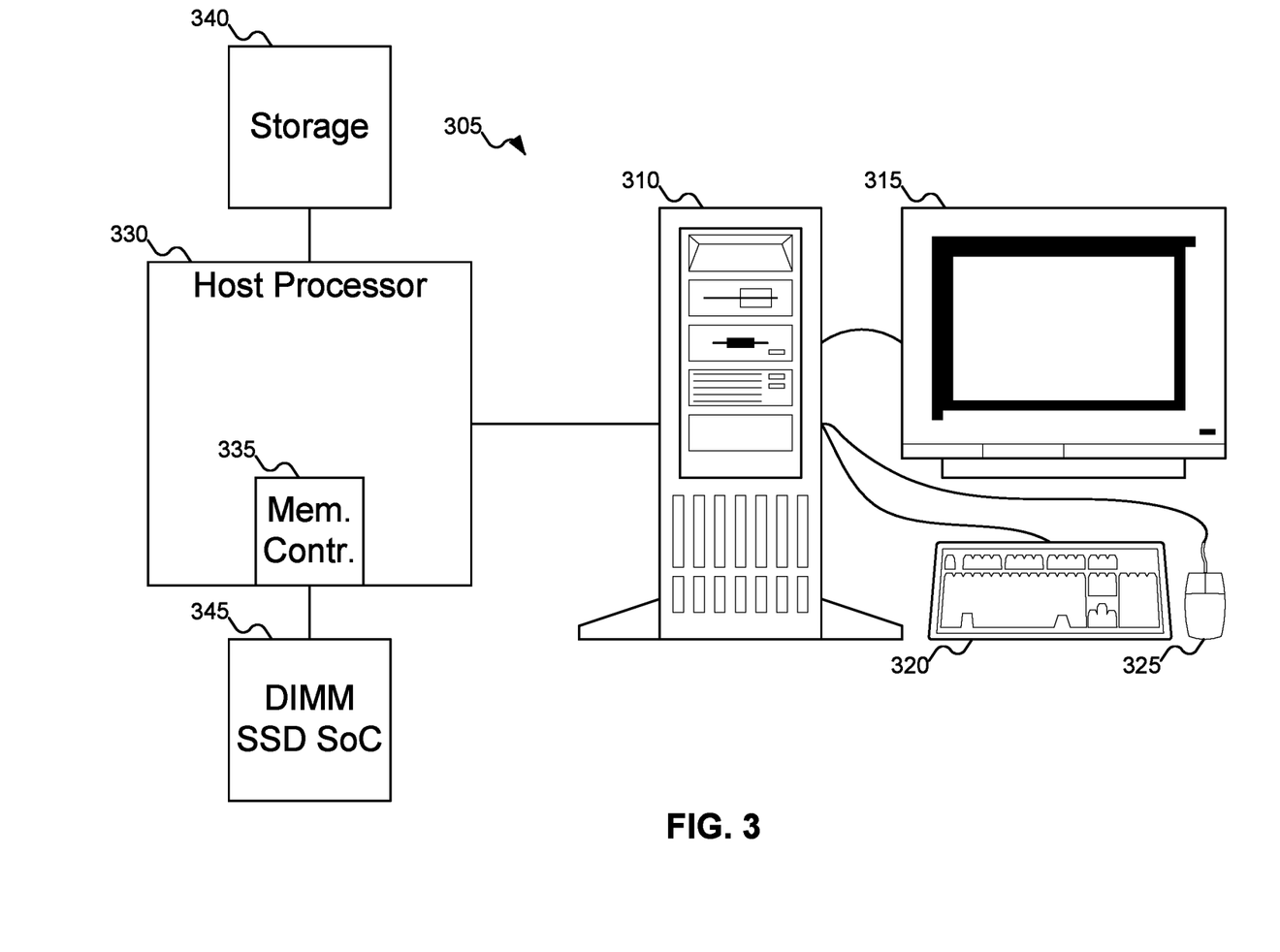
FIG. 3 shows a system capable of supporting the use of a DIMM Solid State Drive (SSD) System-on-a-Chip (SoC), according to an embodiment of the inventive concept.

FIG. 3 shows a system capable of supporting the use of a DIMM Solid State Drive (SSD) System-on-a-Chip (SoC), according to an embodiment of the inventive concept. In FIG. 3, computer system 305 is shown. Computer system 305 is shown as including computer 310, monitor 315, keyboard 320, and mouse 325. A person skilled in the art will recognize that other components can be included with computer system 305: for example, other input/output devices, such as a printer, may be included. In addition, computer system 305 can include conventional internal components, such as host processor 330 with integrated host memory controller 335, storage 340, etc. Although not shown in FIG. 3, a person skilled in the art will recognize that computer system 305 can include other internal components, such as other graphics cards, modems, etc. In addition, a person skilled in the art will recognize that computer system 305 can interact with other computer systems, either directly or over a network (not shown) of any type. Finally, although FIG. 3 shows computer system 305 as a conventional desktop computer, a person skilled in the art will recognize that computer system 305 can be any type of machine or computing device, including, for example, a laptop computer, a tablet computer, a personal digital assistant (PDA), or a smart phone, among other possibilities.

Computer system 305 can also include DIMM SSD SoC 345. In contrast with traditional DIMM modules, such as DRAM that includes multiple chips to store information, DIMM SSD SoC 345 can include a single chip to store all the information. Because all the information is stored on a single chip, the board channel skew that affects traditional DIMM modules is avoided. But, as noted above, since host memory controller 335 expects the memory to have board channel skew, the lack of board channel skew in DIMM SSD SoC 345 can prevent DIMM SSD SoC 345 from interoperating properly with host memory controller 335.

Figure 4:
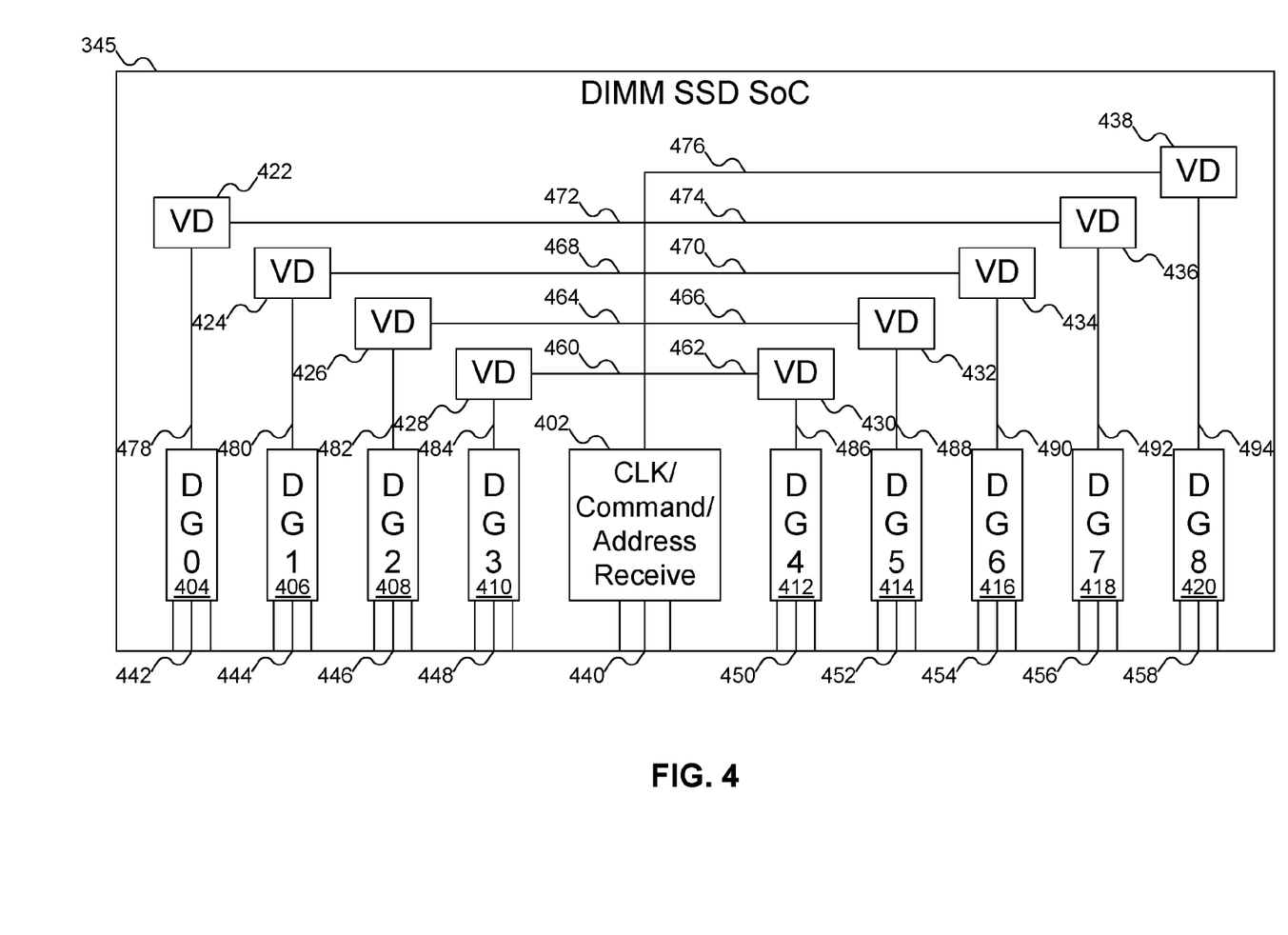
FIG. 4 shows details of the DIMM SSD SoC of FIG. 3.

FIG. 4 shows details of DIMM SSD SoC 345 of FIG. 3. In FIG. 4, DIMM SSD SoC 345 is shown as including clock/command/address receive module 402, various data groups 404, 406, 408, 410, 412, 414, 416, 418, 420, 414, 416, 418, and 420, and various variable delay elements 422, 424, 426, 428, 430, 432, 434, 436, and 438. DIMM SSD SoC 345 can also include interface 440 that enables host processor 330 and host memory controller 335 of FIG. 3 to communicate with clock/command/address receive module 402, and interfaces 442, 444, 446, 448, 450, 452, 454, 456, 458, 452, 454, 456, and 458 to permit data to be exchanged between host processor 330 and host memory controller 335 of FIG. 3 and data groups 404, 406, 408, 410, 412, 414, 416, 418, 420, 414, 416, 418, and 420 (such as data read and write information). Finally, DIMM SSD SoC 345 can also include circuitry 460, 462, 464, 466, 468, 470, 472, 474, 476, 478, 480, 482, 484, 486, 488, 490, 492, and 494 to connect clock/command/address receive module 402, variable delay elements 422, 424, 426, 428, 430, 432, 434, 436, and 438, and data groups 404, 406, 408, 410, 412, 414, 416, 418, 420, 414, 416, 418, and 420.

Variable delay elements 422, 424, 426, 428, 430, 432, 434, 436, and 438 enable data groups 404, 406, 408, 410, 412, 414, 416, 418, 420, 414, 416, 418, and 420 to behave like DRAM modules 110, 115, and 120 of FIGS. 1A-1B. That is, variable delay elements 422, 424, 426, 428, 430, 432, 434, 436, and 438 delay the transmission of clock, transmit, and other signals to data groups 404, 406, 408, 410, 412, 414, 416, 418, 420, 414, 416, 418, and 420 so that the signals are received by data groups 404, 406, 408, 410, 412, 414, 416, 418, 420, 414, 416, 418, and 420 in a staggered manner, just as with traditional DIMMs with DRAM modules. In this manner, DIMM SSD SoC 345 can be representative of a standard Fly-By topology, thereby providing a better signal distribution to decrease signal integrity issues and increasing the maximum bus frequency that the solution will run.

While FIG. 4 shows a group (consisting of data groups 404, 406, 408, 410, 412, 414, 416, 418, 420, 414, 416, 418, and 420) that represents a byte of data, this example represents only one embodiment of the inventive concept. Other embodiments of the inventive concept can store groups of data of other sizes, such as nibbles, words, double words, or any other desired size.

Figure 5:
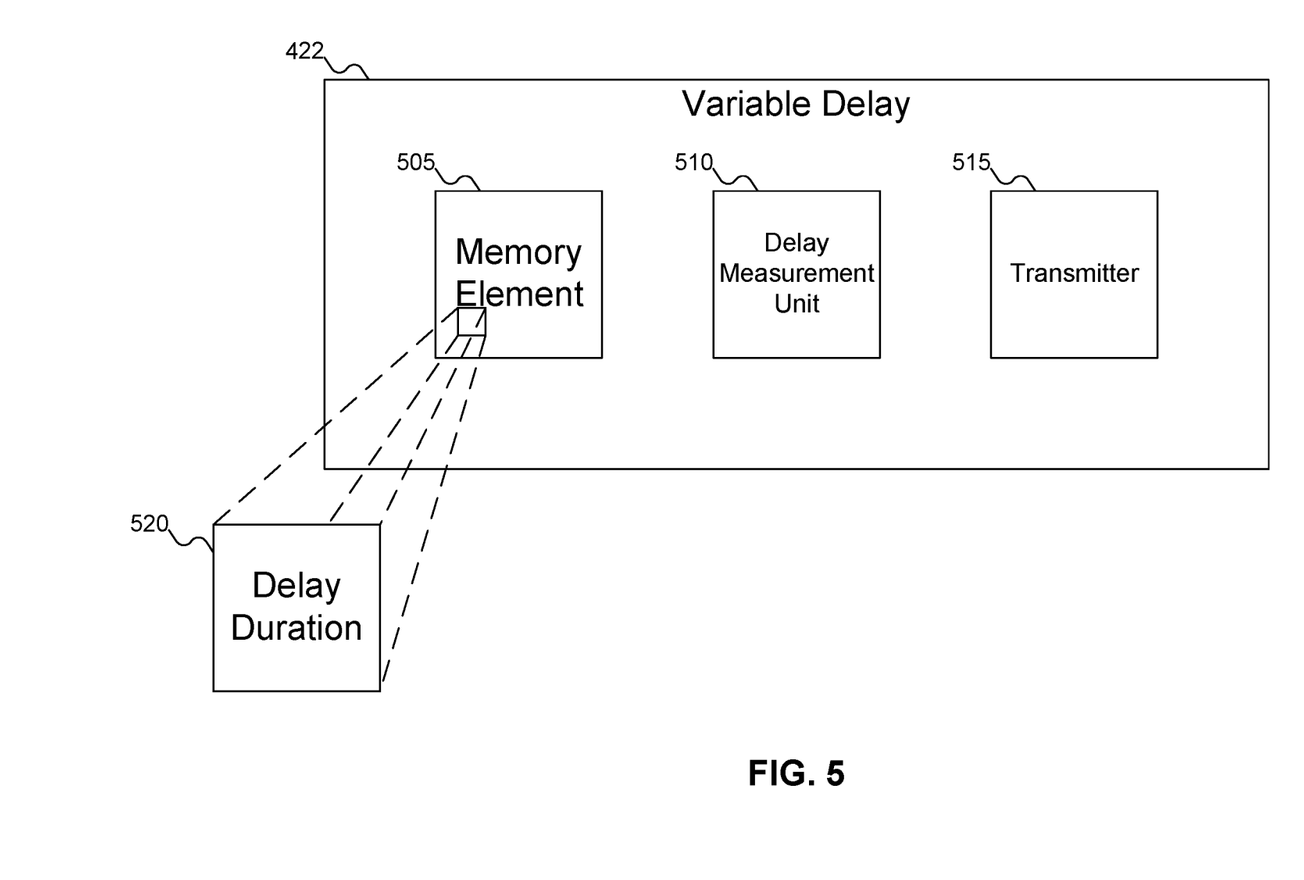
FIG. 5 shows details of the variable delay elements of FIG. 4.

FIG. 5 shows details of an example variable delay element 422 of FIG. 4. In FIG. 5, variable delay element 422 is shown: variable delay elements 424, 426, 428, and 430 can be similarly designed and have similar functionality. Variable delay element 422 can include memory element 505, delay measurement unit 510, and transmitter 515. Memory element 505 can store delay duration 520, which represents the desired duration of delay for variable delay element 422. Delay measurement unit 510 can measure how much time has passed since variable delay element 422 received an appropriate signal (such as a clock signal or a transmit data signal). When delay measurement unit 510 has measured the appropriate delay (as compared with delay duration 520 stored in memory element 505), transmitter 515 can transmit the appropriate signal along circuitry toward a particular data group (such as data group 404 of FIG. 4).

Although delay measurement unit 510 is described as measuring how much "time" has passed, embodiments of the inventive concept are not limited to measuring time in seconds or fractions thereof (for example, one nanosecond (1 ns)). Embodiments of the inventive concept can include any manner of measuring time. For example, delay measurement unit 510 can measure a number of clock cycles, or even a fraction of a clock cycle, to reproduce the staggered delivery of signals in a traditional DIMM using DRAM modules. (How long a clock cycle is can depend on the machine in question, as different machines can run at different speeds. But a clock cycle is, of course, a way to measure time.)

Figure 6A:
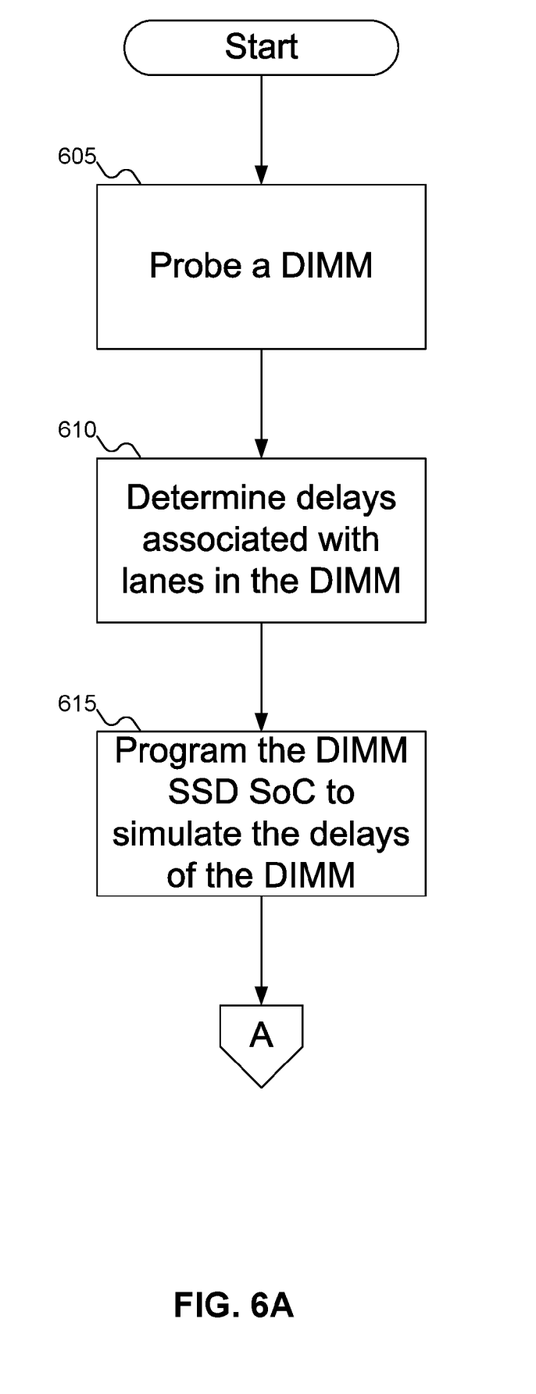
FIGS. 6A-6B show a flowchart of a procedure for programming the variable delay elements of FIG. 4 in the DIMM SSD SoC of FIG. 3 to simulate a DIMM, according to an embodiment of the inventive concept.

FIGS. 6A-6B show a flowchart of a procedure for programming the variable delay elements of FIG. 4 in the DIMM SSD SoC of FIG. 3 to simulate a DIMM, according to an embodiment of the inventive concept. In FIG. 6A, at block 605, a manufacturer of DIMM SSD SoC 345 can probe a traditional DIMM, such as DIMMs 105 and 130 of FIGS. 1A-1B, to determine the board channel skew associated with the lanes of DIMMs 105 and 130 of FIGS. 1A-1B. At block 610, the manufacturer can determine the delays associated with the lanes of DIMMs 105 and 130 of FIGS. 1A-1B. At block 615, the manufacturer can "program" DIMM SSD SoC 345 to replicate the on-DIMM skew associated with DIMMs 105 and 130 of FIGS. 1A-1B.

Figure 6B:
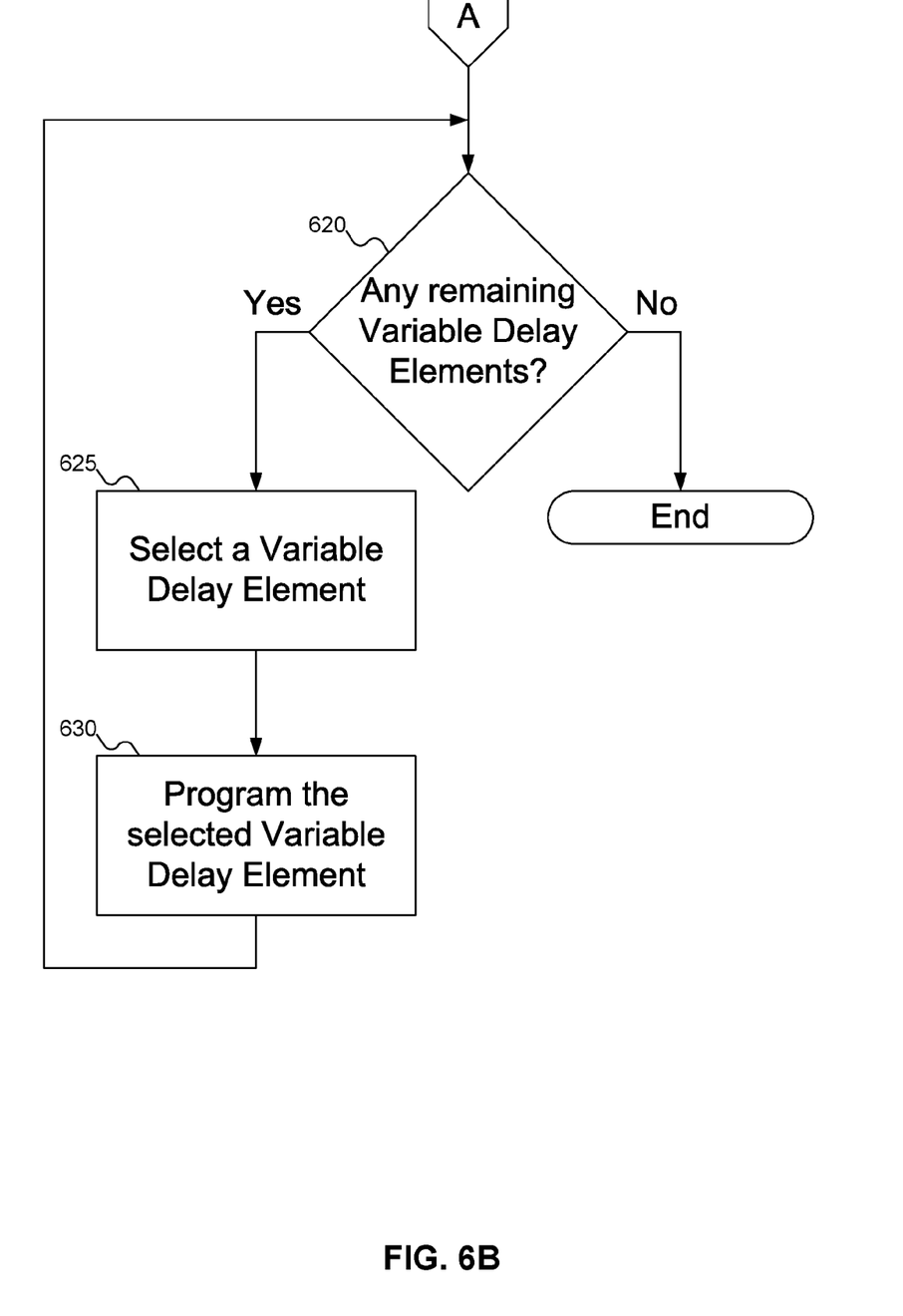

How the manufacturer can "program" DIMM SSD SoC 345 is shown in FIG. 6B. At block 620, the manufacturer can determine if there are any variable delay elements 422, 424, 426, 428, 430, 432, 434, 436, and 438 that require "programming". If so, then at block 625, the manufacturer can select one of variable delay elements 422, 424, 426, 428, 430, 432, 434, 436, and 438, and at block 630, the manufacturer can program variable delay elements 422, 424, 426, 428, 430, 432, 434, 436, and 438.

In the context of FIGS. 6A-6B, "programming" can mean installing specific variable delay elements that provide the desired delays (where the specific variable delay elements are designed to provide a specific delay), or instructing general variable delay elements what level of delay to use, for example by coding some variant of a Programmable Read-Only Memory (PROM), among other possibilities. "Programming" should not be interpreted solely as software code that can be executed on a processor.

In FIGS. 6A-6B, one embodiment of the inventive concept is shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

Figure 7:
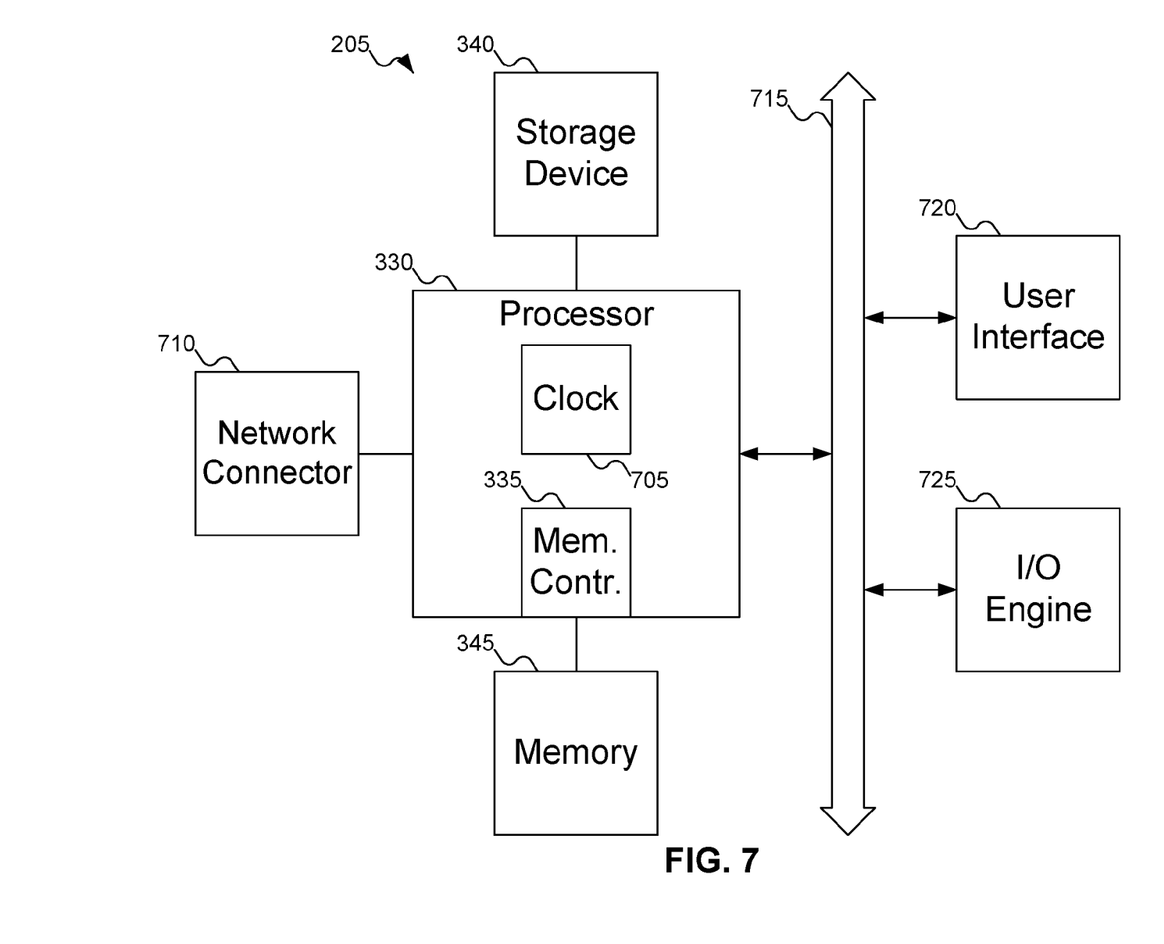
FIG. 7 shows a device that can use DIMM SSD SoCs, as described above with reference to FIGS. 2A-6B.

The following discussion is intended to provide a brief, general description of a suitable machine or machines in which certain aspects of the inventive concept can be implemented. Referring to FIG. 7, typically, machine or machines 205 include one or more processors 330, which can include memory controller 335 and clock 705, which can be used to coordinate the operations of the components of machine or machines 305. Processors 330 can also be coupled to memory 345, which can include random access memory (RAM), read-only memory (ROM), or other state preserving medium, as examples, in addition to DIMM SSD SoC 345. Processors 330 can also be coupled to storage devices 340 and network connector 710, which can be, for example, an Ethernet connector. Processors 330 can also be connected to a bus 715, to which can be attached user interface 720 and input/output interface ports that can be managed using input/output engine 725, among other components.

The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Embodiments of the inventive concept can include a tangible, non-transitory machine-readable medium comprising instructions executable by one or more processors, the instructions comprising instructions to perform the elements of the inventive concepts as described herein.

Having described and illustrated the principles of the inventive concept with reference to illustrated embodiments, it will be recognized that the illustrated embodiments can be modified in arrangement and detail without departing from such principles, and can be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept can extend to the following statements, without limitation:

Statement 1. An embodiment of the inventive concept includes a Dual In-Line Memory Module (DIMM) Solid State Drive (SSD) System-on-a-Chip (SoC) (345), comprising:
  a controller chip (402);
  a first interface (440) to transmit signals between a host processor (330) and the controller chip (402);
  a plurality of data groups (404, 406, 408, 410, 412, 414, 416, 418, 420), each data group capable of storing a portion of information for a group;
  a second interface (442, 444, 446, 448, 450, 452, 454, 456, 458) to transmit information between the host processor (330) and the plurality of data groups (404, 406, 408, 410, 412, 414, 416, 418, 420);
  a plurality of variable delay elements (422, 424, 426, 428, 430, 432, 434, 436, 438);
  first circuitry (460, 462, 464, 466, 468, 470, 472, 474, 476) connecting the controller chip (402) to each of the plurality of variable delay elements (422, 424, 426, 428, 430, 432, 434, 436, 438); and
  second circuitry (478, 480, 482, 484, 486, 488, 490, 492, 494) to connect each of the plurality of variable delay elements (422, 424, 426, 428, 430, 432, 434, 436, 438) with one of the plurality of data groups (404, 406, 408, 410, 412, 414, 416, 418, 420),
  wherein each of the plurality of variable delay elements (422, 424, 426, 428, 430, 432, 434, 436, 438) can be configured to reproduce a chosen skew delay representative of a Fly-By DIMM topology.

Statement 2. An embodiment of the inventive concept includes a DIMM SSD SoC (345) according to statement 1, wherein each of the plurality of variable delay elements (422, 424, 426, 428, 430) includes:
  a memory element (505) to store a delay duration (520);
  a delay measurement unit (510) to measure the delay duration (520); and
  a transmitter (515) to transmit a signal after the delay measurement unit (510) has measured the delay duration (520).

Statement 3. An embodiment of the inventive concept includes a DIMM SSD SoC (345) according to statement 2, wherein:
  the memory element (505) is operative to store the delay duration (520) measured in clock cycles; and
  the delay measurement unit (510) is operative to measure a number of clock cycles.

Statement 4. An embodiment of the inventive concept includes a DIMM SSD SoC (345) according to statement 1, wherein:
  the group includes a byte of information; and
  the plurality of data groups (404, 406, 408, 410, 412, 414, 416, 418, 420) simulates a x8 DRAM construction.

Statement 5. An embodiment of the inventive concept includes a DIMM SSD SoC (345) according to statement 1, wherein:
  the group includes a nibble of information; and
  the plurality of data groups (404, 406, 408, 410, 412, 414, 416, 418, 420) simulates a x4 DRAM construction.

Statement 6. An embodiment of the inventive concept includes a DIMM SSD SoC (345) according to statement 1, wherein the plurality of variable delay elements (422, 424, 426, 428, 430, 432, 434, 436, 438) can be statically configured to reproduce the chosen skew delay.

Statement 7. An embodiment of the inventive concept includes a DIMM SSD SoC (345) according to statement 1, wherein the plurality of variable delay elements (422, 424, 426, 428, 430, 432, 434, 436, 438) can be dynamically configured to reproduce the chosen skew delay.

Statement 8. An embodiment of the inventive concept includes a DIMM SSD SoC (345) according to statement 1, wherein the plurality of variable delay elements (422, 424, 426, 428, 430, 432, 434, 436, 438) delay a clock signal (205) to the plurality of data groups (404, 406, 408, 410, 412, 414, 416, 418, 420).

Statement 9. An embodiment of the inventive concept includes a DIMM SSD SoC (345) according to statement 8, wherein the plurality of data groups (404, 406, 408, 410, 412, 414, 416, 418, 420) can receive staggered clock signals (215, 220, 225, 230) from the plurality of variable delay elements (422, 424, 426, 428, 430, 432, 434, 436, 438).

Statement 10. An embodiment of the inventive concept includes a DIMM SSD SoC (345) according to statement 1, wherein the plurality of variable delay elements (422, 424, 426, 428, 430, 432, 434, 436, 438) can delay a transmit signal to the plurality of data groups (404, 406, 408, 410, 412, 414, 416, 418, 420).

Statement 11. An embodiment of the inventive concept includes a DIMM SSD SoC (345) according to statement 8, wherein the plurality of data groups (404, 406, 408, 410, 412, 414, 416, 418, 420) can receive staggered transmit signals from the plurality of variable delay elements (422, 424, 426, 428, 430, 432, 434, 436, 438).

Statement 12. An embodiment of the inventive concept includes a method, comprising:
  probing (605) a Dual In-Line Memory Module (DIMM);
  determining (610) a plurality of delays in the DIMM associated with lanes in a group; and
  structuring (615) a DIMM Solid State Drive (SSD) System-on-a-Chip (SoC) (345) with the plurality of delays to simulate the DIMM using the DIMM SSD SoC (345).

Statement 13. An embodiment of the inventive concept includes a method according to statement 12, wherein structuring (615) a DIMM SSD SoC (345) with the plurality of delays includes structuring (615) the DIMM SSD SoC (345) to reproduce the plurality of delays on a plurality of data groups (404, 406, 408, 410, 412, 414, 416, 418, 420) in the group.

Statement 14. An embodiment of the inventive concept includes a method according to statement 12, wherein structuring (615) the DIMM SSD SoC (345) to reproduce the plurality of delays on a plurality of data groups (404, 406, 408, 410, 412, 414, 416, 418, 420) in the group includes programming (630) a delay duration for each of the plurality of delays in a one of plurality of variable delay elements (422, 424, 426, 428, 430, 432, 434, 436, 438), each of the plurality of variable delay elements (422, 424, 426, 428, 430, 432, 434, 436, 438) connected to one of the plurality of data groups (404, 406, 408, 410, 412, 414, 416, 418, 420).

Statement 15. An embodiment of the inventive concept includes a method according to statement 13, wherein structuring (615) the DIMM SSD SoC (345) to reproduce the plurality of delays on a plurality of data groups (404, 406, 408, 410, 412, 414, 416, 418, 420) in the group includes structuring (615) the DIMM SSD SoC (345) to reproduce the plurality of delays on a plurality of clock signals (205), each of the plurality of clock signals (205) going to one data group.

Statement 16. An embodiment of the inventive concept includes a method according to statement 15, wherein structuring (615) the DIMM SSD SoC (345) to reproduce the plurality of delays on a plurality of clock signals (205) includes structuring (615) the DIMM SSD SoC (345) to stagger the plurality of clock signals (205) to the plurality of data groups (404, 406, 408, 410, 412, 414, 416, 418, 420).

Statement 17. An embodiment of the inventive concept includes a method according to statement 13, wherein structuring (615) the DIMM SSD SoC (345) to reproduce the plurality of delays on a plurality of data groups (404, 406, 408, 410, 412, 414, 416, 418, 420) in the group includes structuring (615) the DIMM SSD SoC (345) to reproduce the plurality of delays on a plurality of transmit signals, each of the plurality of clock signals (205) going to one data group.

Statement 18. An embodiment of the inventive concept includes a method according to statement 17, wherein structuring (615) the DIMM SSD SoC (345) to reproduce the plurality of delays on a plurality of data groups (404, 406, 408, 410, 412, 414, 416, 418, 420) in the group includes structuring (615) the DIMM SSD SoC (345) to stagger the plurality of transmit signals to the plurality of data groups (404, 406, 408, 410, 412, 414, 416, 418, 420).

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

What is claimed is:

1. A Dual In-Line Memory Module (DIMM) Solid State Drive (SSD) System-on-a-Chip (SoC), comprising:
    a controller chip;
    a first interface to transmit signals between a host processor and the controller chip;
    a plurality of data groups, each data group capable of storing a portion of information for a group;
    a second interface to transmit information between the host processor and the plurality of data groups;
    a plurality of variable delay elements;
    first circuitry connecting the controller chip to each of the plurality of variable delay elements; and
    second circuitry to connect each of the plurality of variable delay elements with one of the plurality of data groups,
    wherein each of the plurality of variable delay elements is configured to reproduce a chosen skew delay representative of a Fly-By DIMM topology, and
    wherein the chosen skew delay is determined by probing a Dual In-Line Memory Module (DIMM).

2. A DIMM SSD SoC according to claim 1, wherein:
    the group includes a byte of information; and
    the plurality of data groups simulates a x8 DRAM construction.

3. A DIMM SSD SoC according to claim 1, wherein:
    the group includes a nibble of information; and
    the plurality of data groups simulates a x4 DRAM construction.

4. A DIMM SSD SoC according to claim 1, wherein the plurality of variable delay elements may be statically configured to reproduce the chosen skew delay.

5. A DIMM SSD SoC according to claim 1, wherein the plurality of variable delay elements may be dynamically configured to reproduce the chosen skew delay.

6. A DIMM SSD SoC according to claim 1, wherein the plurality of variable delay elements delay a clock signal to the plurality of data groups.

7. A DIMM SSD SoC according to claim 6, wherein the plurality of data groups may receive staggered clock signals from the plurality of variable delay elements.

8. A DIMM SSD SoC according to claim 1, wherein the plurality of variable delay elements may delay a transmit signal to the plurality of data groups.

9. A DIMM SSD SoC according to claim 8, wherein the plurality of data groups may receive staggered transmit signals from the plurality of variable delay elements.

10. A method, comprising:
    probing a Dual In-Line Memory Module (DIMM) to determine a plurality of delays in the DIMM associated with lanes in a group; and
    structuring a DIMM Solid State Drive (SSD) System-on-a-Chip (SoC) with the plurality of delays to simulate the DIMM using the DIMM SSD SoC.

11. A method according to claim 10, wherein structuring a DIMM SSD SoC with the plurality of delays includes structuring the DIMM SSD SoC to reproduce the plurality of delays on a plurality of data groups in the group.

12. A method according to claim 10, wherein structuring the DIMM SSD SoC to reproduce the plurality of delays on a plurality of data groups in the group includes programming a delay duration for each of the plurality of delays in a one of plurality of variable delay elements, each of the plurality of variable delay elements connected to one of the plurality of data groups.

13. A method according to claim 11, wherein structuring the DIMM SSD SoC to reproduce the plurality of delays on a plurality of data groups in the group includes structuring the DIMM SSD SoC to reproduce the plurality of delays on a plurality of clock signals, each of the plurality of clock signals going to one data group.

14. A method according to claim 13, wherein structuring the DIMM SSD SoC to reproduce the plurality of delays on a plurality of clock signals includes structuring the DIMM SSD SoC to stagger the plurality of clock signals to the plurality of data groups.

15. A method according to claim 11, wherein structuring the DIMM SSD SoC to reproduce the plurality of delays on a plurality of data groups in the group includes structuring the DIMM SSD SoC to reproduce the plurality of delays on a plurality of transmit signals, each of the plurality of clock signals going to one data group.

16. A method according to claim 15, wherein structuring the DIMM SSD SoC to reproduce the plurality of delays on a plurality of data groups in the group includes structuring the DIMM SSD SoC to stagger the plurality of transmit signals to the plurality of data groups.

* * * * *